United States Patent
Schnabel et al.

(10) Patent No.: US 7,355,218 B2
(45) Date of Patent: Apr. 8, 2008

(54) SEMICONDUCTOR COMPONENT WITH A MOS TRANSISTOR

(75) Inventors: Rainer Florian Schnabel, Hoehenkirchen (DE); Michael Bernhard Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/202,634

(22) Filed: Aug. 12, 2005

(65) Prior Publication Data

US 2006/0049436 A1    Mar. 9, 2006

(30) Foreign Application Priority Data

Aug. 13, 2004   (DE) .................. 10 2004 039 424

(51) Int. Cl.
*H01L 27/10* (2006.01)
(52) U.S. Cl. .................. 257/204; 257/206; 257/368; 257/371; 257/E27.065; 257/E27.066; 257/E29.019
(58) Field of Classification Search ............. 257/256, 257/288, 360, 367, 373, E27.049, E27.05, 257/E29.05, E29.195, E29.268, E29.279, 257/204, 206, 368, 371, E27.065, E27.066, 257/E29.019
See application file for complete search history.

(56) References Cited

U.S. PATENT DOCUMENTS

| 5,365,083 | A | 11/1994 | Tada |
| 5,686,739 | A | 11/1997 | Baba |
| 5,936,265 | A * | 8/1999 | Koga .................. 257/105 |
| 6,015,993 | A | 1/2000 | Voldman et al. |
| 6,617,643 | B1 | 9/2003 | Goodwin-Johansson |
| 6,767,810 | B2 | 7/2004 | Salling et al. |
| 2003/0071310 | A1* | 4/2003 | Salling et al. ............. 257/355 |

FOREIGN PATENT DOCUMENTS

| JP | 05190847 | 7/1993 |
| JP | 11220122 A | 8/1999 |

OTHER PUBLICATIONS

Wang, P.,-F., et al., "Complementary tunneling transistor for low power application," Solid-State Electronics, vol. 48, pp. 2281-2286, 2004, Elsevier Ltd.

* cited by examiner

*Primary Examiner*—Minhloan Tran
*Assistant Examiner*—Benjamin Tzu-Hung Liu
(74) *Attorney, Agent, or Firm*—Slater & Matsil, L.L.P.

(57) ABSTRACT

The source area (3) is highly doped, like the channel area, for the same conductance type. The drain area (4) is doped for the opposite conductance type. This results in a saving of area since the source connection (S) can at the same time be used as the well connection or substrate connection.

22 Claims, 2 Drawing Sheets

SEMICONDUCTOR COMPONENT WITH A MOS TRANSISTOR

This application claims priority to German Patent Application 10 2004 039 424.5, which was filed Aug. 13, 2004, and is incorporated herein by reference.

TECHNICAL FIELD

The present invention relates generally to semiconductor devices and methods, and more particularly to semiconductor components with a MOS transistor.

BACKGROUND

In the case of semiconductor components, particularly in the case of memory components, it is desirable for the circuit components to have as high an integration density as possible. An extremely miniaturized chip can be used in many products and, on the other hand, the costs involved in production are reduced when as large a number of semiconductor chips as possible can be produced from one semiconductor wafer. The yield of semiconductor chips per wafer is an important component in the financial viability of production. The electronic circuits on the chips are thus not only becoming evermore extensive and complicated, but efforts are also being made to produce fundamentally equivalent circuits in ever smaller structures and thus on ever smaller semiconductor chips. The capability to reduce the size of semiconductor structures ever further, which is referred to by the expression "shrinkability" is, however, restricted by the technical limits of the production process.

One particular problem in this case is represented by the well contacts to which the implantation areas formed in the substrate are electrically connected. The wells are required in particular for the production of mutually complementary MOS transistors. During the implantation, dopants are introduced by means of which the semiconductor material is doped to be n-conductive or p-conductive. The conductive areas are intended, inter alia, as the source and drain of the field-effect transistors. During the implantation of the dopants, however, undesirable scatters occur, and subsequent diffusion out of the implantation area into the surrounding semiconductor material occurs when the dopant is activated and healed, so that the dimensions of the wells and of the component structures formed therein cannot be indefinitely reduced in size.

Attempts have already been made to minimize the respectively required chip area by the arrangement of the components on the chip and, in particular, skillful arrangement of the well contacts and substrate contacts. However, in this case, it is necessary to arrange the well contacts sufficiently far away from the source and drain contacts. If the contacts are too close to one another, scattering effects and diffusion effects occur during the implantation of the dopants that are introduced for the two different conductance types, and these adversely affect the quality of the connecting contacts. When isolation trenches, in particular so-called STI trenches (shallow trench isolation) are provided in order to limit the implantation regions and in order to prevent diffusion of the dopants into adjacent semiconductor material, this considerably increases the area consumed on the wafer.

SUMMARY OF THE INVENTION

In one aspect, the present invention provides a semiconductor component with MOS transistors and well contacts, by means of which it is possible to reduce the size below the dimensions that have been possible until now.

In one embodiment, a semiconductor component with a MOS transistor is formed in a semiconductor material that is doped to a first conductivity type in an area extending to an upper face. The semiconductor component includes a source area formed in the semiconductor material. The source area is more highly doped to the first conductivity type than adjacent portions of the semiconductor material. A drain area is formed in the semiconductor material at a distance from the source area. The drain area is highly doped to a second conductivity type that is opposite of the first conductivity type. A gate electrode is arranged on the upper face and electrically insulated from the semiconductor material between the source area and the drain area. The semiconductor component further includes an electrical connection to the source area, the electrical connection further providing an electrical connection to the semiconductor material between the source area and the drain area.

The solution according to embodiments of the invention overrcomes the problem with the aid of a novel method of making contact with the wells. Contact is no longer produced separately with the substrate or with the wells, so that they must be fitted physically separately but integrated in the same way for all transistors for which provision is made for the source area to be connected to the potential of the well or of the substrate. By way of example, a correspondingly designed NMOS transistor then does not have two $n^+$-conductive doped areas as the source and drain in a p-conductive well or a p-doped substrate, but only one $n^+$-conductive doped drain area. Higher doping for $p^+$-conductance is provided as the source area. This on the one hand makes it possible to form a resistive contact for the channel of the transistor and, on the other hand, to produce a resistive contact to the relevant well.

The simplification resulting from this is particularly important in the case of very regular structures, for example, in the case of a memory component. Particularly in the case of a sense amplifier or a segmented word line driver, the configuration of the well contacts according to embodiments of the invention makes it possible to achieve significant area savings on the wafer. One significant factor with the semiconductor component according to embodiments of the invention is that polarity reversal, in comparison to conventional transistors, of the source contact on all those transistors in which the source potential and the well potential match.

The stated well or substrate contact is particularly advantageous when MOS transistors configured in this way are integrated jointly on a chip with conventional transistors, referred to in the following text as standard transistors. In this case, it is possible to provide for the well contacts or substrate contacts to be isolated in this way from the oppositely doped source areas and drain areas of the standard transistors in such a way that a further transistor structure, referred to in the following text as an isolating transistor, is arranged with a gate electrode between the standard transistors and the well contact. At the same time, the well contact may be a source connection of one of those MOS transistors for which the potential of the well is provided for the source connection. In the case of an NMOS transistor, which is provided as an isolating transistor such as this, the gate electrode is preferably at a low potential, in particular at ground. This allows contact to be made with the well without any disturbing influences becoming evident on the contacts of the standard transistors.

DESCRIPTION OF THE DRAWINGS

The following text contains a more detailed description of examples of the semiconductor component with reference to the attached FIGS. 1 to 4.

Figure 1:
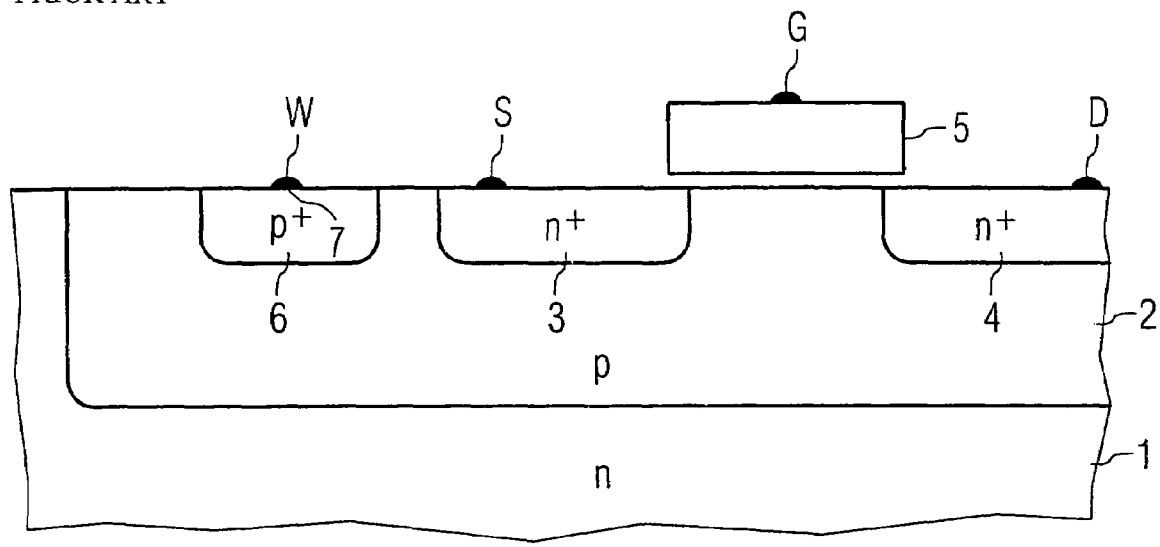
FIG. 1 shows a cross-section through a MOS transistor according to the prior art.

The following list of reference symbols can be used in conjunction with the figures:

1 Substrate
2 p-well
3 Source area
4 Drain area
5 Gate electrode
6 Well connecting area
7 Well contact
8 Standard transistor
9 Isolating transistor
10 Well connecting area
11 Drain area
12 Gate electrode
13 Ground connection
14 Drain area
15 Gate electrode
16 Well connection transistor
D Drain connection
G Gate connection
S Source connection
W Well connection

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 illustrates a semiconductor component with a MOS transistor according to the prior art, in the form of a cross-section. This shows a substrate 1 composed of semiconductor material, in which at least one area, which is provided on the upper face, is electrically conductively doped for a first conductance type. In the illustrated example, the first conductance type is p-conductance, and the semiconductor material, that is doped to be p-conductive, is formed by a p-well 2 in the substrate 1. The semiconductor material which surrounds this p-well 2 can likewise be a well, in this example an n-well, when two or more wells are interleaved in one another, in order that mutually complementary transistors can be produced in a substrate which is provided, for example, with basic p-doping.

If p-conductively doped semiconductor material is provided in the upper face area, this results in an NMOS transistor there. This NMOS transistor has a highly n-conductively doped source area 3 and a likewise highly n-conductively doped drain area 4 arranged at a distance from it. The p-doped semiconductor material, which is provided for the channel area, is located in between.

In order to control the channel, a gate electrode 5 is arranged on the upper face and is isolated from the semiconductor material by means of electrically insulating material (gate oxide), which is not illustrated in detail. Connections of the source S, gate G and drain D are illustrated, somewhat schematically. The electrical connections may also be provided within the substrate or on vias to interconnects on a metallization level. The p-well 2 is provided with a well connection W, which is arranged on a highly p-conductively doped well connecting area 6, on which the well contact 7 is fitted. In this case, this results in the problem mentioned initially, i.e., that the well connecting area 6 must not be arranged too closely alongside the source area 3.

Figure 2:
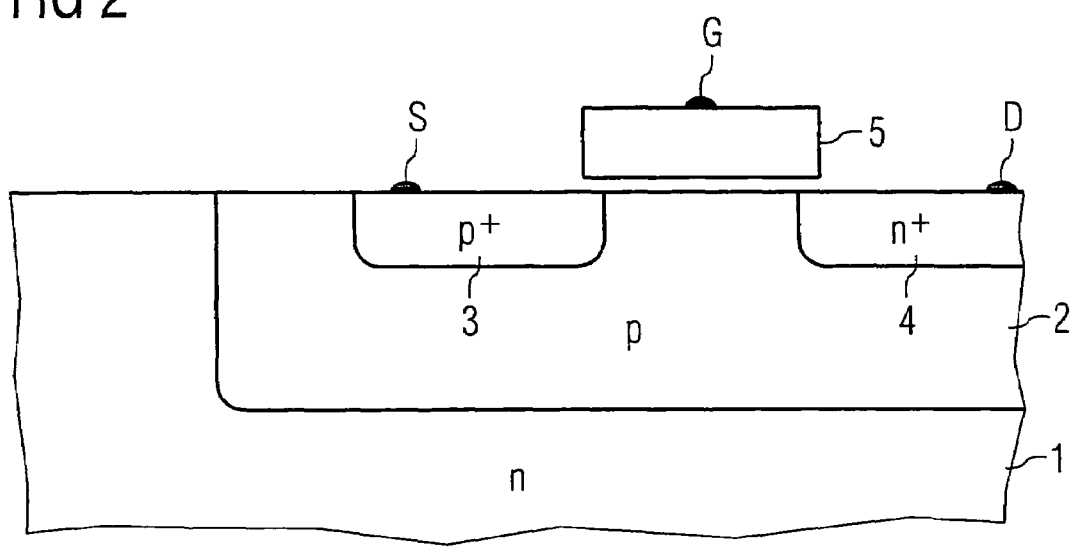
FIG. 2 shows a cross-section through a semiconductor component according to the invention with a MOS transistor.

FIG. 2 shows a cross-section through a semiconductor component according to the invention, which allows a more compact arrangement of the structure. For better comparison with the component according to the prior art as illustrated in FIG. 1, the p-conductively doped area is also illustrated as a p-well 2 in the exemplary embodiment illustrated in FIG. 2. The conductance types can be interchanged with one another so that a corresponding configuration according to the invention is also possible for a PMOS transistor. In other examples, the p-region 2 can be a bulk semiconductor substrate (e.g., monocrystalline silicon) or a semiconductor layer in a semiconductor-on-insulator substrate.

In this case, the source area 3 is formed by a highly p-conductively doped area. Only the drain area 4 is highly n-conductively doped. The source area 3 has the same mathematical sign of conductance type as the well in which the source area 3 is arranged. Both the source 3 and drain 4 are highly doped. The source connection S thus at the same time acts as a well connection and as a substrate connection. No separate well connection is therefore required. A respective junction is provided here from the source area 3 to the channel area and to the well. In the case of this transistor, which is referred to in the following text as a well connection transistor in order to distinguish it from the standard transistors, the source area is in each case at the same electrical potential as the well and the substrate.

Figure 3:
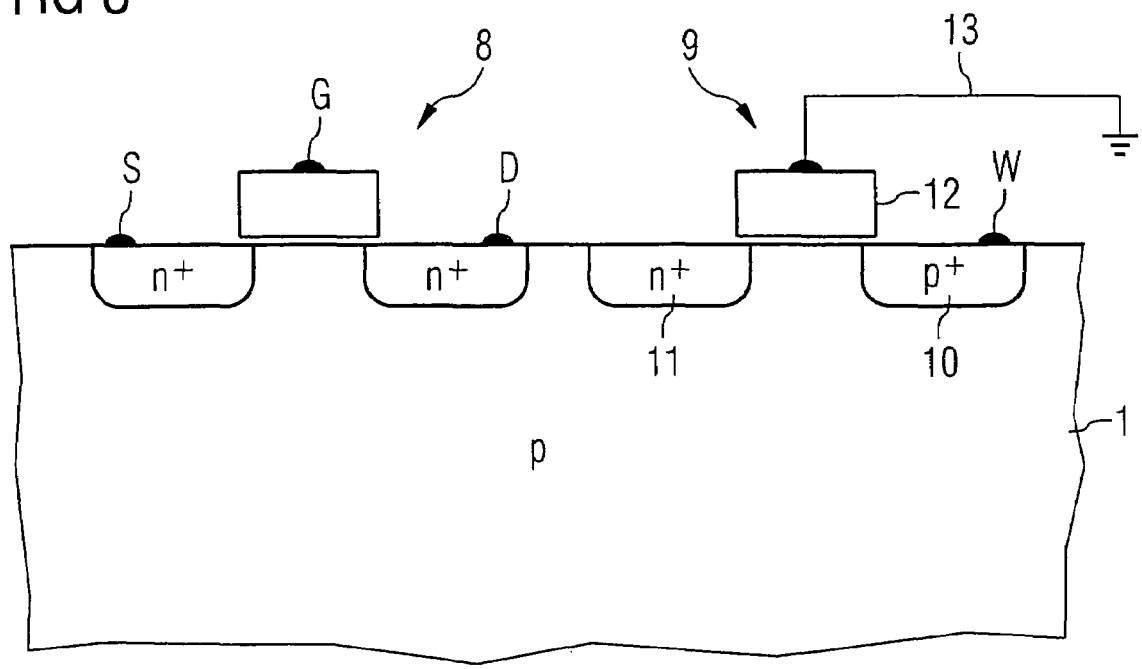
FIG. 3 shows a cross-section through a further exemplary embodiment with standard transistors.

In order to isolate the well contact or substrate contact from the source areas and drain areas of the standard transistors, it is possible to provide a structure as illustrated, in the form of an example, in the cross-section in FIG. 3. The component structure illustrated in the form of a detail and cross-section in FIG. 3 has a standard transistor 8 in which both the source area and the drain area are highly doped for the opposite conductivity mathematical sign to that of the channel area. In the example of the NMOS transistor, the source and drain are thus highly n-conductively doped. The structure of a transistor, which is referred to in the following text as an isolating transistor 9, is arranged adjacent to this and is intended to isolate the standard transistors from the transistor structures, the well connection transistors, according to embodiments of the invention.

A transistor structure of an isolating transistor 9 is located between an area that is provided as a well connecting area 10 and is highly doped for the first conductance type, that is to say for p-conductance in the example, and the standard transistor 8 and, apart from a further drain area 11, which is highly n-conductively doped, has a further gate electrode 12. This gate electrode 12 is intended to electrically isolate the standard transistors 8 from the well connection transistors. In the case of the NMOS transistor, this is done by connecting the gate electrode 12 to low potential, for example, by means of a ground connection 13. Fundamentally, however, it is also possible to provide a PMOS transistor as an isolating transistor such as this. There is no need to provide a separate drain area 11 for the isolating transistor 9, as is illustrated in FIG. 3.

Figure 4:
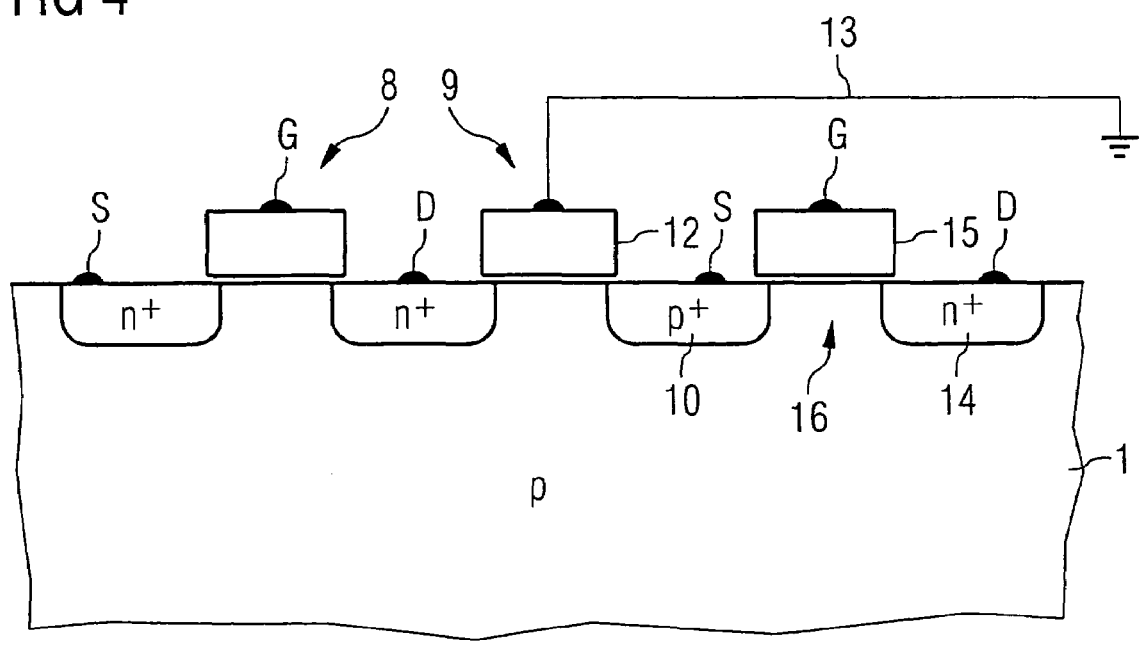
FIG. 4 shows an alternative to the exemplary embodiment in the cross-section shown in FIG. 3.

In the case of an alternative, further simplified exemplary embodiment, a cross-section of which is illustrated in FIG. 4, a drain area of a standard transistor 8 is also used as the drain area for the structure of the isolating transistor 9. The well connecting area 10 is the source area of the isolating transistor 9. An example illustrated here is also in this case an NMOS transistor whose gate electrode 12 is preferably connected once to ground. For illustrative purposes, FIG. 4 also shows that the well connecting area 10 can also be provided as the source area of a further transistor, which is designed according to embodiments of the invention and is part of an integrated circuit, and which has a drain area 14 and a gate electrode 15. The transistor that is illustrated on the right-hand side in FIG. 4 is a well connection transistor 16 in which, according to embodiments of the invention, the well connection corresponds to the connection of the source area, so that there is no need for a separate well connection. The source area is thus formed by the well connecting area 10 and has the same conductivity mathematical sign as the channel area of this well connection transistor 16.

The well connection transistors may be NMOS transistors or PMOS transistors. Both transistor types can be integrated together with standard transistors in fundamentally any desired quantity and arrangement, combined on the semiconductor component. Semiconductor circuits with transistors whose source areas are connected to the same electrical potential as the associated well and the substrate can thus be produced in the simplified manner according to the invention by using the relevant source areas of these transistors as well connecting areas at the same time. This makes it possible to achieve a considerable saving in area in comparison to conventional semiconductor components.

What is claimed is:

1. An integrated circuit comprising:
   a semiconductor body of a first conductivity type;
   a first highly doped region of a second conductivity type disposed in the semiconductor body, the second conductivity type being different than the first conductivity type;
   a second highly doped region of the second conductivity type disposed in the semiconductor body and spaced from the first highly doped region;
   a first electrode overlying and insulated from the semiconductor body between the first highly doped region and the second highly doped region such that a transistor comprising the first highly doped region, the second highly doped region and the first electrode is formed;
   a fourth highly doped region of the first conductivity type disposed in the semiconductor body and spaced from the second highly doped region; and
   a second electrode overlying and insulated from the semiconductor body between the second highly doped region and the fourth highly doped region, the second electrode being coupled to a reference supply voltage node, wherein the second electrode is physically separate from the first electrode.

2. The integrated circuit of claim 1, further comprising a third highly doped region disposed between the second highly doped region and the fourth highly doped region and spaced from the second highly doped region, the second electrode being disposed between the third highly doped region and the fourth highly doped region.

3. The integrated circuit of claim 1 further comprising a third highly doped region, wherein the fourth highly doped region is disposed between the second highly doped region and the third highly doped region.

4. The integrated circuit of claim 1, wherein the reference supply voltage node comprises ground.

5. The integrated circuit of claim 1, wherein the semiconductor body comprises a semiconductor substrate.

6. The integrated circuit of claim 1, wherein the semiconductor body comprises a well region.

7. The integrated circuit of claim 1, wherein the semiconductor body comprises a semiconductor layer of a semiconductor-on-insulator structure.

8. The integrated circuit of claim 1, wherein the first conductivity type is p-type, and the second conductivity type is n-type.

9. An integrated circuit comprising:
   a semiconductor body of a first conductivity type;
   a first highly doped region of a second conductivity type disposed in the semiconductor body, the second conductivity type being different than the first conductivity type;
   a second highly doped region of the second conductivity type disposed in the semiconductor body and spaced from the first highly doped region;
   a first electrode overlying and insulated from the semiconductor body between the first highly doped region and the second highly doped region such that a transistor comprising the first highly doped region, the second highly doped region and the first electrode is formed;
   a third highly doped region of the first conductivity type disposed in the semiconductor body and spaced from the second highly doped region;
   a second electrode overlying and insulated from the semiconductor body between the second highly doped region and the third highly doped region, the second electrode being coupled to a reference supply voltage node;
   a fourth highly doped region of the second conductivity type disposed in the semiconductor body and spaced from the third highly doped region; and
   a third electrode overlying and insulated from the semiconductor body between the third highly doped region and the fourth highly doped region, wherein the first electrode is physically separate from the second electrode, the first electrode is physically separate from the third electrode, and the second electrode is physically separate from the third electrode.

10. The integrated circuit of claim 9, wherein the first conductivity type is p-type, and the second conductivity type is n-type.

11. The integrated circuit of claim 9, wherein the reference supply voltage node comprises ground.

12. The integrated circuit of claim 9, wherein the semiconductor body is held at the same electrical potential as the third highly doped region.

13. The integrated circuit of claim 9, wherein a second transistor is formed from the third highly doped region, the fourth highly doped region and the third electrode.

14. An integrated circuit comprising:
   a semiconductor body of a first conductivity type;
   a first highly doped region of a second conductivity type disposed in the semiconductor body, the second conductivity type being different than the first conductivity type;

a second highly doped region of the second conductivity type disposed in the semiconductor body and spaced from the first highly doped region;

a first electrode overlying and insulated from the semiconductor body between the first highly doped region and the second highly doped;

a third highly doped region of the second conductivity type disposed in the semiconductor body;

a fourth highly doped region of the first conductivity type disposed in the semiconductor body and spaced from the third highly doped region; and a second electrode overlying and insulated from the semiconductor body between the third highly doped region and the fourth highly doped region, the second electrode being coupled to a reference supply voltage node, wherein the second electrode is electrically isolated from the first electrode.

15. The integrated circuit of claim 14, wherein the reference supply voltage node comprises ground.

16. The integrated circuit of claim 14, wherein the semiconductor body comprises a well region.

17. The integrated circuit of claim 14, wherein the first conductivity type is p-type, and the second conductivity type is n-type.

18. The integrated circuit of claim 14, wherein the third highly doped region is spaced from the second highly doped region.

19. An integrated circuit comprising:

a semiconductor body of a first conductivity type;

a first highly doped region of a second conductivity type disposed in the semiconductor body, the second conductivity type being different than the first conductivity type;

a second highly doped region of the second conductivity type disposed in the semiconductor body and spaced from the first highly doped region;

a first electrode overlying and insulated from the semiconductor body between the first highly doped region and the second highly doped region;

a third highly doped region of the first conductivity type disposed in the semiconductor body and spaced from the second highly doped region;

a second electrode overlying and insulated from the semiconductor body between the second highly doped region and the third highly doped region, the second electrode being coupled to a reference supply voltage node;

a fourth highly doped region of the second conductivity type disposed in the semiconductor body and spaced from the third highly doped region; and a third electrode overlying and insulated from the semiconductor body between the third highly doped region and the fourth highly doped region, wherein the first electrode is electrically isolated from the second electrode, and the second electrode is electrically isolated from the third electrode.

20. The integrated circuit of claim 19, wherein the reference supply voltage node comprises ground.

21. The integrated circuit of claim 19, wherein the semiconductor body comprises a well region.

22. The integrated circuit of claim 19, wherein the first conductivity type is p-type, and the second conductivity type is n-type.

* * * * *